Figure 3:
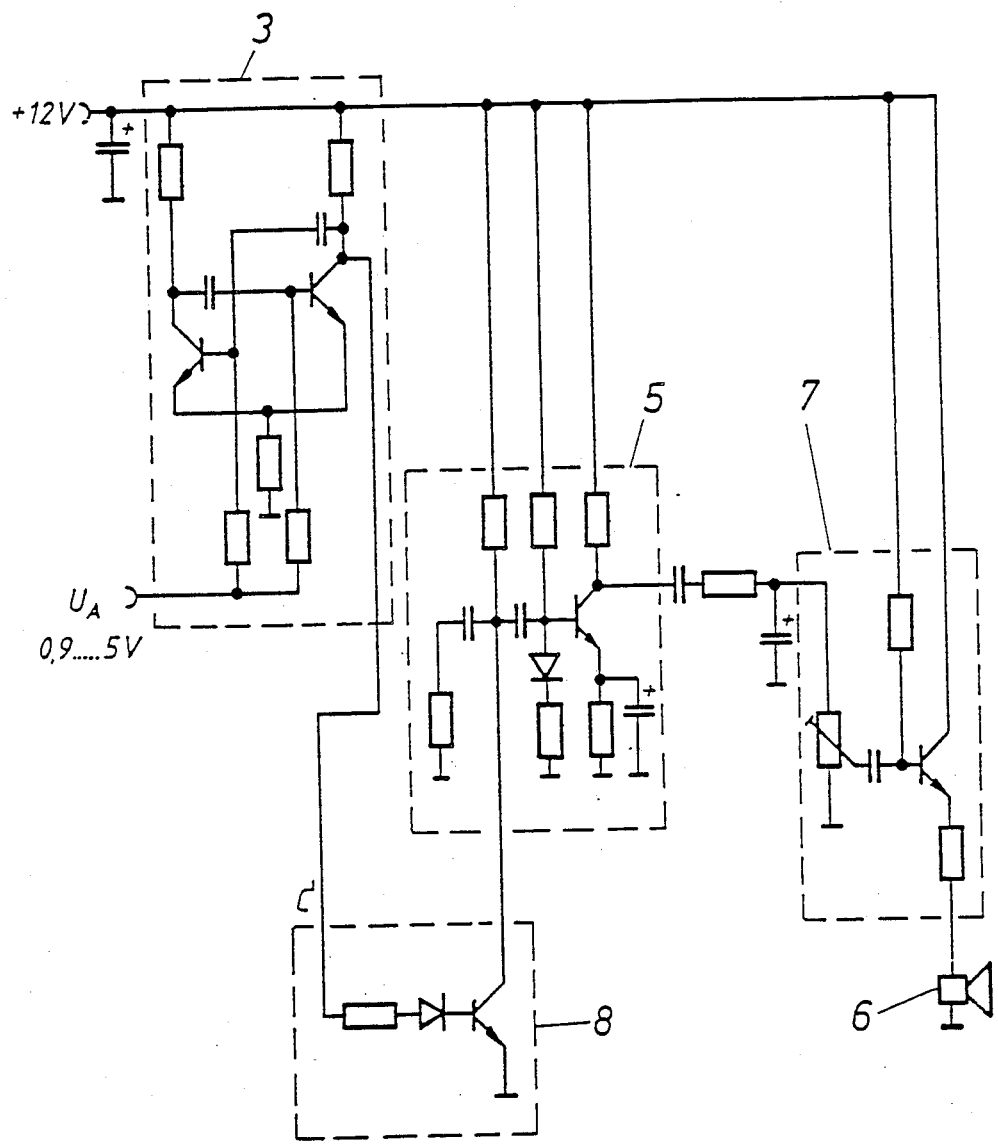

United States Patent [19]

Maier et al.

[11] Patent Number: 4,893,288
[45] Date of Patent: Jan. 9, 1990

[54] AUDIBLE ANTENNA ALIGNMENT APPARATUS

[75] Inventors: Gerhard Maier, Dauchingen; Veit Armbruster, St. Georgen, both of Fed. Rep. of Germany

[73] Assignee: Deutsche Thomson-Brandt GmbH, Villingen-Schwenningen, Fed. Rep. of Germany

[21] Appl. No.: 246,541
[22] PCT Filed: Nov. 28, 1987
[86] PCT No.: PCT/EP87/00740
  § 371 Date: Aug. 26, 1988
  § 102(e) Date: Aug. 26, 1988
[87] PCT Pub. No.: WO88/04478
  PCT Pub. Date: Jun. 16, 1988

[30] Foreign Application Priority Data

Dec. 3, 1986 [DE] Fed. Rep. of Germany ....... 3641310

[51] Int. Cl.$^4$ .............................................. H01Q 3/00
[52] U.S. Cl. ..................................... 367/116; 342/359
[58] Field of Search ........................ 367/116; 342/359; 324/62

[56] References Cited

U.S. PATENT DOCUMENTS 4,182,990  1/1980  Coffin et al. .................... 325/364
4,280,204  7/1981  Elchinger ......................... 367/116

FOREIGN PATENT DOCUMENTS 0092600  11/1983  European Pat. Off. .
2639529   3/1978  Fed. Rep. of Germany .
60-65633   4/1985  Japan .
2066469   7/1981  United Kingdom .

OTHER PUBLICATIONS

Vander Horst, Alignment Squeaker or an 'Audible Signal-Strength Indicator', Oct. 1976, p. 1029.
"Reflecties Door PAoSE", Jul. 1976, no translation, p. 399.

Primary Examiner—Thomas H. Tarcza
Assistant Examiner—Daniel T. Pihulic
Attorney, Agent, or Firm—Max Fogiel

[57] ABSTRACT

An arrangement for aligning an antenna by determining an extreme value maximum or minimum of a predetermined physical dimension which is dependent on the alignment of the antenna. A voltage is generated in proportion in the magnitude of the physical parameter or dimension, and this voltage is applied to a voltage-to-frequency converter which converts this voltage into an acoustical signal. This acoustical signal has a frequency which is inversely proportional to the voltage. The acoustical signal is applied to the control input of an electronic switch which is actuated by an oscillator. Groups of pulses in the output signal from the oscillator are obtainable at the output of the electronic switch, in synchronization with the acoustical signal. When the antenna is misaligned, the acoustical signal has a relatively high frequency, while the voltage has a relatively low level. When the antenna is close to alignment on the other hand, the frequency of the acoustical signal is relatively low, while the voltage has a relatively high level.

2 Claims, 2 Drawing Sheets

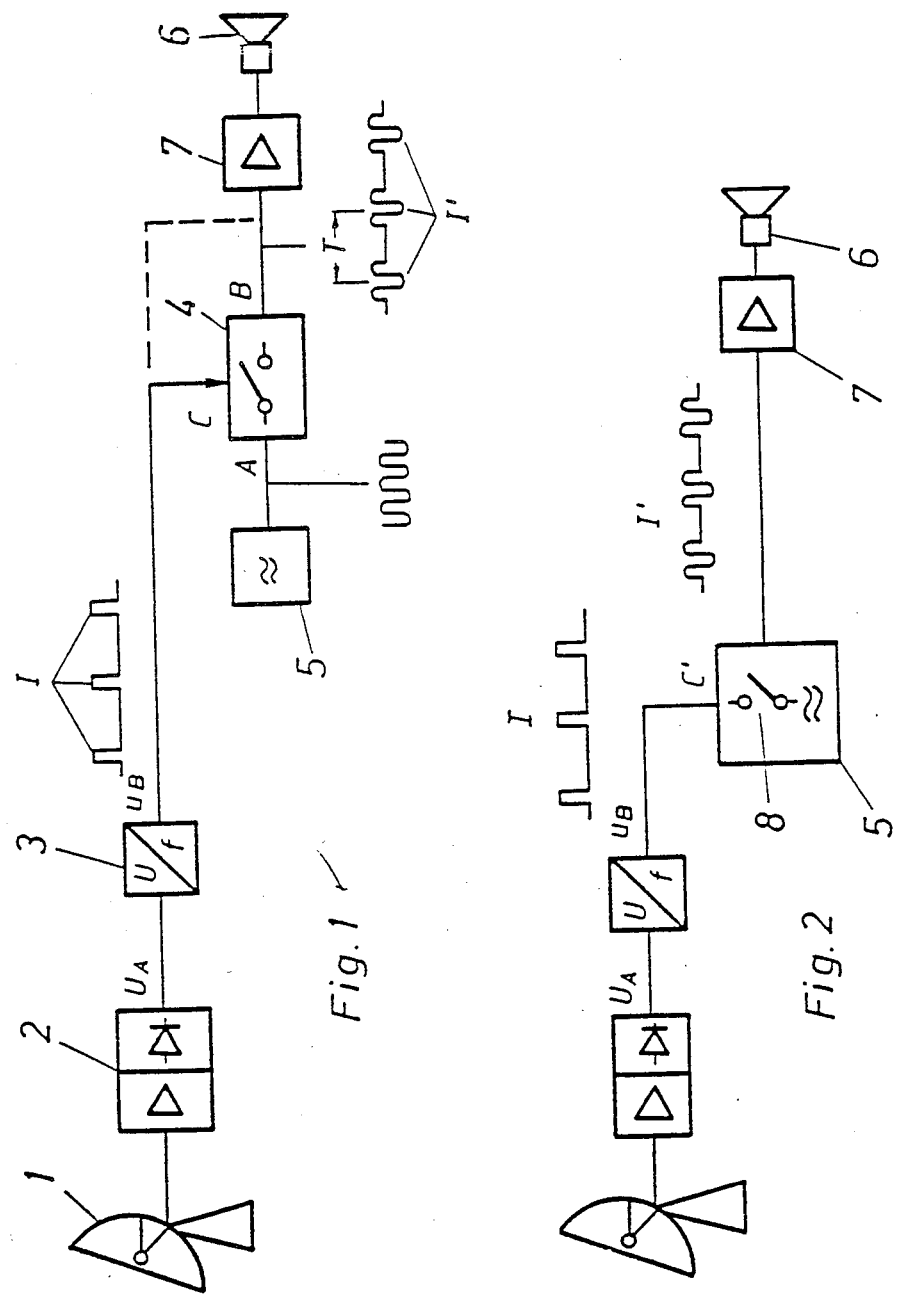

AUDIBLE ANTENNA ALIGNMENT APPARATUS

The invention concerns a system for determining the extreme value of a physical dimension.

The extreme value of a physical dimension must often be determined. It is for example important to establish the maximum output voltage of a receiver, either to tune the device or to correctly orient a receiving antenna. A measurement receiver is known that contributes to the precise adjustment of the parabolic mirror in a satellite receiver for example (Funkschau 22 [1968], 59). A measurement receiver of this type, however, is very complex and accordingly expensive. Furthermore, it can only operated by highly-trained personnel and it is often difficult to read the optimal setting from the scale. Remote control of the optimal orientation of an antenna is also known, with the result displayed on a video-display terminal. This of course requires a monitor for the display, and this solution is also expensive.

The object of the invention is to provide the simplest possible system for determining the extreme value of a physical dimension and in particular for determining the maximum output voltage of a distributing amplifier and hence the optimal orientation of an antenna.

This object is attained by the invention recited in the major claim. Other advantageous embodiments of the invention will be evident from the subsidiary claims.

One embodiment of the invention will now be specified with reference to the drawing, wherein FIG. 1 is a block diagram of the invention, FIG. 2 is another block diagram of the invention, and FIG. 3 is a circuit diagram of a detail of the system illustrated in FIG. 2.

The optimal orientation of an antenna 1 can be determined by measuring the rectified intermediate-frequency output voltage $U_A$ of a distributing antenna 2. Output voltage $U_A$ is supplied to a voltage-to-frequency converter 3 that emits a low frequency when output voltage $U_A$ is high. The frequency of output voltage $U_A$ becomes higher as the voltage becomes lower, when, that is, antenna 1 is incorrectly oriented. The output voltage $U_B$ from voltage-to-frequency converter 3 consists of pulses I, which can for example be converted into an acoustic signal by an electrical-to-acoustic converter. The output voltage $U_B$ in the figure is exploited in the form of pulses to activate an electronic switch 4 by applying pulses I to the control input terminal C of electronic switch 4. The switch remains closed subject to the pulses and forwards a signal generated in the audible range of 1000 Hz for instance by an oscillator 5 to the input terminal A of electronic switch 4. A package of pulses I' can be obtained from the output terminal B of switch 4, amplified in a low-frequency amplifier 7, and rendered audible by an electronic converter 6. When antenna 1 is to be adjusted, output voltage $U_A$ is initially very low, so that the 1000-Hz package of pulses I' will follow one another very rapidly. As the optimal orientation is approached, pulses I' will be heard at constantly longer intervals apart until, depending on the design of voltage-to-frequency converter 3, they will no longer occur. One advantage of the invention is that even personnel that are not highly trained or even trained at all will be able to adjust the antenna because an acoustic signal is more definite and easier to evaluate than the difficult-to-read deflection of a needle on a scale.

FIG. 2 is another block diagram illustrating the invention. Whereas the signal voltage from the constantly vibrating oscillator 5 in FIG. 1 is forwarded through controlled switch 4 in synchronization with the pulses from voltage-to-frequency converter 3, FIG. 2 illustrates another way of generating package of pulses I', wherein oscillator 5 itself is activated in synchronization with pulses I through a control input terminal C' and a switch B.

FIG. 3 is a detailed circuit diagram of the variant illustrated in FIG. 2.

We claim:

1. A system for aligning an antenna comprising: means for producing a voltage dependent on alignment; a voltage-to-frequency converter for converting said voltage into a converted signal having a frequency within the audible range and being inversely proportional to said voltage; a switching stage with a control input, said converted signal being applied in form of a switching signal to said control input; said switching stage having an input and an output; an oscillator having an output signal switched over to said input of said switching stage at a constant frequency within the audible range, groups of pulses in said output signal from said oscillator being obtainable at said output of said switching stage in synchronization with said converted signal from said voltage-to-frequency converter, said voltage having a relatively low value when said antenna is substantially misaligned, said converted signal from said converter having a relatively high frequency when said antenna is substantially misaligned and said voltage has a relatively low value; said voltage having a relatively high value when said antenna is in substantial alignment, said converted signal from said converter having a relatively low frequency when said antenna is in substantial alignment and said voltage has a relatively high value, said converted signal being audible to an operator and having a substantially zero frequency sensed easily by said operator when said antenna is in alignment.

2. A system for aligning an antenna comprising: a distributing antenna having an output voltage dependent on the orientation of said antenna; a voltage-to-frequency converter receiving said output voltage from said distributing antenna and converting said output voltage to a first signal with frequency within the audible range, the frequency of said first signal being inversely proportional to said output voltage, so that when the antenna is incorrectly oriented, said output voltage is relatively low and said frequency is relatively high; said voltage-to-frequency converter having an output signal comprised of pulses convertible into an audible signal by an electrical-to-acoustic converter; an electronic switch actuated by said pulses and having a control input for receiving said pulses; an oscillator generating a second signal within the audible range and applying said second signal to an input of said electronic switch, said switch remaining closed by said pulses and forwarding said second signal generated by said oscillator; said electronic switch having an output supplying a group of pulses; a low-frequency amplifier receiving said group of pulses and amplifying said group of pulses; said electrical-to-acoustic converter converting said amplified group of pulses into said audible signal; said voltage being relatively low and said group of pulses having a relatively high frequency when said antenna requires alignment; said voltage being relatively high and said group of pulses having a relatively low frequency when said antenna is substantially aligned, said groups of pulses being absent when said antenna is correctly aligned.

* * * * *